(12) United States Patent
Yoon

(10) Patent No.: US 12,252,339 B2
(45) Date of Patent: Mar. 18, 2025

(54) ARTICLE TRANSPORT VEHICLE AND ARTICLE TRANSPORT FACILITY

(71) Applicant: SEMES CO., LTD., Cheonan-si (KR)

(72) Inventor: Ki Sub Yoon, Suwon-si (KR)

(73) Assignee: SEMES CO., LTD., Cheonan-si (KR)

( * ) Notice: Subject to any disclaimer, the term of this patent is extended or adjusted under 35 U.S.C. 154(b) by 845 days.

(21) Appl. No.: 17/461,706

(22) Filed: Aug. 30, 2021

(65) Prior Publication Data
US 2022/0063909 A1 Mar. 3, 2022

(30) Foreign Application Priority Data
Aug. 31, 2020 (KR) .......................... 10-2020-0110399

(51) Int. Cl.
| | | |
|---|---|---|
| *B60L 53/12* | (2019.01) | |
| *B60L 5/00* | (2006.01) | |
| *B60L 53/122* | (2019.01) | |
| *B65G 1/04* | (2006.01) | |
| *B60L 58/15* | (2019.01) | |

(52) U.S. Cl.
CPC ............ *B65G 1/0421* (2013.01); *B60L 5/005* (2013.01); *B60L 53/122* (2019.02); *B60L 58/15* (2019.02); *B60L 2200/26* (2013.01); *B60L 2240/54* (2013.01)

(58) Field of Classification Search
CPC ..... B65G 1/0421; B60L 5/005; B60L 53/122; B60L 58/15; B60L 2200/26; B60L 2240/54
See application file for complete search history.

(56) References Cited

U.S. PATENT DOCUMENTS

| | | | |
|---|---|---|---|
| 2015/0244185 A1 | 8/2015 | Won et al. | |
| 2017/0008700 A1* | 1/2017 | Wada | ........................ B61B 3/02 |
| 2017/0225904 A1* | 8/2017 | Murakami | .............. B60L 5/005 |
| 2018/0275668 A1 | 9/2018 | Diehr et al. | |

FOREIGN PATENT DOCUMENTS

| | | | | |
|---|---|---|---|---|
| JP | 2012-55103 | | 2/2012 | |
| JP | 2012055103 A | * | 3/2012 | |
| KR | 10-2014-0014424 | | 2/2014 | |
| KR | 20140014424 A | * | 2/2014 | |
| KR | 10-2015-0099272 | | 8/2015 | |
| KR | 20200039229 A | * | 4/2020 | |
| WO | WO-2014139455 A1 | * | 9/2014 | ............ B60L 11/182 |
| WO | WO-2020098935 A1 | * | 5/2020 | .............. B60L 53/12 |

* cited by examiner

*Primary Examiner* — Zachary L Kuhfuss

(57) ABSTRACT

The present disclosure provides an article transport vehicle and an article transport facility capable of allowing the article transport vehicles to share power. In addition, the present disclosure provides the article transport vehicle and the article transport facility capable of normally managing the article transport vehicle even though a non-power supply section, in which no electric supply line is installed along a rail, is lengthened. According to the present disclosure, it is possible to normally manage the article transport vehicle and relatively easily ensure power stored in the battery even though a supply of power from the electric supply line is cut off or no electric supply line is installed along the traveling rail.

18 Claims, 14 Drawing Sheets

ARTICLE TRANSPORT VEHICLE AND ARTICLE TRANSPORT FACILITY

CROSS-REFERENCE TO RELATED APPLICATIONS

This application claims the priority of Korean Patent Application No. 10-2020-0110399 filed on Aug. 31, 2020, in the Korean Intellectual Property Office, the disclosure of which is incorporated herein by reference.

BACKGROUND

Field

An embodiment of the present disclosure relates to an article transport vehicle and an article transport facility, which are configured to transport an article from any position to a target position.

Description of the Related Art

To improve semiconductor manufacturing efficiency, technologies for improving various types of processes (e.g., exposure, deposition, etching, ion-doping, cleaning, etc.) performed by semiconductor manufacturing facilities are applied, and facilities for more effectively transporting containers for storing articles (e.g., wafers) between the semiconductor manufacturing facilities are used. For example, article transport facilities are often used, and each article transport facility includes an overhead hoist transport (OHT) configured to transport an article while moving along a transport route provided on a ceiling of a semiconductor manufacturing factory.

The article transport facility including the overhead hoist transport (hereinafter, referred to as the 'OHT') includes a traveling rail configured to define the transport route, a vehicle configured to travel along the traveling rail, and a hoist device disposed at a lower side of the vehicle. The hoist device supports the article to be transported. In the article transport facility, the vehicle and the hoist device constitute an article transport vehicle. The article transport vehicle is configured to operate by being supplied with driving power from a power supply device through a power supplying unit and a power receiving unit. The power supplying unit includes an electric supply line, and the electric supply line is provided along the transport route. The article transport vehicle includes the power receiving unit and may be supplied with power while moving along the transport route.

The transport route may include a non-power supply section (e.g., a curved section curvedly formed or a connection section for branching or merging the routes) in which no electric supply line is installed and thus the driving power cannot be supplied. During the process of managing the article transport facility, the supply of driving power may be abnormally cut off due to various types of errors such as an overload or a power failure. The article transport vehicle may be unintentionally stopped in the non-power supply section. In an emergency situation in which the supply of driving power is abnormally cut off, the article transport vehicle, which is traveling on the transport route, may collide with another article transport vehicle on the transport route or deviate from the transport route or the article being transported by the article transport vehicle may be dropped.

In addition, a vehicle test system may be provided to check whether the article transport vehicle operates normally. For example, a vehicle test facility is provided to check whether the article transport vehicle operates normally, and the vehicle test facility conveys the vehicle having a problem to a maintenance facility. When the article transport vehicle enters the vehicle test facility, an operator removes a connection member connected to the power receiving unit included in the article transport vehicle, connects a cable, which is connected to the vehicle test facility, to the article transport vehicle, and then supplies power to the vehicle test facility, thereby testing the article transport vehicle. The operator may remove the cable from the vehicle, which has been completely tested, mount the connection member on the vehicle again, and then return the vehicle to the traveling rail or move the vehicle to the maintenance facility. In this case, the connection member is mounted on the vehicle again and the vehicle is returned without being mounted with the connection member in a state in which the supply of power to the cable is not cut off, which may cause a problem such as a risk of fire or a traveling error.

DOCUMENTS OF RELATED ART

Patent Documents (Patent Document 1) Korean Patent Application Laid-Open No. 10-2019-0063951 (Jun. 10, 2019)
(Patent Document 2) Korean Patent No. 10-2010772 (Oct. 21, 2019)
(Patent Document 3) Korean Patent No. 10-2069587 (Jan. 23, 2020)

SUMMARY

The present disclosure has been made in an effort to provide an article transport vehicle and an article transport facility capable of allowing the article transport vehicles to share power.

The present disclosure has also been made in an effort to provide an article transport vehicle and an article transport facility capable of normally managing the article transport vehicle even though there is no electric supply line provided along a rail.

The present disclosure has also been made in an effort to provide a vehicle test facility capable of supplying power in a wireless manner.

Technical problems to be solved by the present disclosure are not limited to the above-mentioned technical problems, and other technical problems, which are not mentioned above, may be clearly understood by those skilled in the art from the following descriptions.

An embodiment of the present disclosure provides an article transport vehicle including: a vehicle main body configured to transport an article while traveling along a traveling rail; a first power source device configured to receive power from an electric supply line installed on the traveling rail and supply the power to the vehicle main body; and a second power source device including a battery and a power sharing module disposed on the vehicle main body, the second power source device being configured to supply power, stored in the battery, to the vehicle main body.

In this case, the second power source device may be configured such that the battery receives the power from the first power source device and stores the power.

In addition, the second power source device may be configured such that the battery shares power with a battery of another vehicle by means of the power sharing module.

The vehicle main body may include: a vehicle module configured to travel along the traveling rail; and a hoist device disposed below the vehicle module and configured to support the article, and the second power source device may be disposed on the hoist device.

The hoist device may include: a hoist housing configured to define an accommodation space that accommodates the article; a hand unit configured to grip or release the article; and a hand moving unit configured to move the hand unit between a first position at which the article is accommodated in the accommodation space and a second position spaced apart from the first position, and the second power source device may be mounted on the hoist housing.

The second power source device may further include a power control unit, and the power control unit may control a supply of power so that the power stored in the battery is supplied to the vehicle main body when a supply of power from the first power source device to the vehicle main body is cut off.

Meanwhile, when the supply of power from the first power source device to the vehicle main body is cut off and the amount of power stored in the battery is sufficient, the power control unit may control the power sharing module to provide power to another vehicle in which the amount of power stored in the battery is equal to or smaller than a predetermined amount of power or no power is stored in the battery.

In addition, when the supply of power from the first power source device to the vehicle main body is cut off and the amount of power stored in the battery is equal to or smaller than a predetermined amount of power or no power is stored in the battery, the power control unit may control the power sharing module to receive power from another vehicle in which the amount of power stored in the battery is sufficient.

Meanwhile, the power sharing module may be configured in a wireless manner.

Meanwhile, the article transport vehicle may further include a wireless charging pad capable of supplying power to the battery.

The wireless charging pad may be disposed on an outer wall of the hoist housing and fixed at a position corresponding to the battery.

In addition, the wireless charging pad may be configured to charge the battery when the amount of power stored in the battery is consumed overall or equal to or smaller than a predetermined amount of power.

Another embodiment of the present disclosure provides an article transport facility including: a traveling rail disposed on a ceiling and configured to provide a transport route for transporting an article; an electric supply line installed on the traveling rail; at least one article transport vehicle including a vehicle module configured to travel along the traveling rail, and a hoist device disposed below the vehicle module and configured to support the article; a first power source device configured to receive power from the electric supply line and supply the power to the vehicle module and the hoist device of the article transport vehicle; a second power source device including a battery provided in the hoist device, and a power sharing module configured to share power of the battery with another article transport vehicle, the second power source device being configured to supply the vehicle module and the hoist device with the power stored in the battery; and a wireless charging pad configured to supply the power to the battery, in which the second power source device is configured to receive power from the first power source device, the power sharing module, or the wireless charging pad and store the power in the battery.

In this case, the hoist device may include a hoist housing configured to provide an accommodation space that accommodates the article; a hand unit configured to grip or release the article; and a hand moving unit configured to move the hand unit.

In addition, the second power source device may control a supply of power so that the power stored in the battery is supplied to the vehicle main body when a supply of power from the first power source device to the vehicle main body is cut off, in which when the amount of power stored in the battery is sufficient, the second power source device controls the power sharing module to approach and provide power to another vehicle in which the amount of stored power is equal to or smaller than a predetermined amount of power or no power is stored in the battery, and in which when the amount of power stored in the battery is equal to or smaller than a predetermined amount of power or no power is stored in the battery, the second power source device controls the power sharing module to receive power from another vehicle in which the amount of stored power is sufficient.

In addition, the wireless charging pad may be configured to charge the battery when the amount of power stored in the battery is consumed overall or equal to or smaller than a predetermined amount of power.

Meanwhile, the article transport facility may further include a vehicle test facility configured to supply power in a wireless manner and inspect a state of the article transport vehicle before the article transport vehicle is loaded to the rail.

The vehicle test facility may include a charging module configured to charge the second power source device included in the article transport vehicle.

The charging module may charge the battery in a non-contact manner or quickly charge the battery.

Still another embodiment of the present disclosure provides an article transport facility including: a traveling rail disposed on a ceiling and configured to provide a transport route for transporting an article; an electric supply line installed on the traveling rail; at least one article transport vehicle including a vehicle module configured to travel along the traveling rail, and a hoist device disposed below the vehicle module and configured to support the article; a first power source device configured to receive power from the electric supply line and supply the power to the vehicle module and the hoist device of the article transport vehicle; a second power source device including a battery provided in the hoist device, and a power sharing module configured to share power of the battery with another article transport vehicle, the second power source device being configured to supply the vehicle module and the hoist device with the power stored in the battery; a wireless charging pad configured to supply the power to the battery; and a vehicle test facility configured to inspect a state of the article transport vehicle and supply power in a wireless manner, in which the second power source device is configured to receive power from the first power source device, the power sharing module, or the wireless charging pad and store the power in the battery, and in which the vehicle test facility includes a charging module capable of quickly charging the battery included in the second power source device.

According to the embodiment of the present disclosure, the article transport vehicle includes the first power source device configured to receive the power from the electric supply line and supply the power to the article transport vehicle, and the second power source device configured to store the power from the first power source device and supply the power to the article transport vehicle. Therefore, the article transport vehicle may normally operate even though the transport route includes the non-power supply section. In addition, since the second power source device includes the power sharing module, one article transport vehicle may share the power of the battery with another article transport vehicle. Therefore, when the remaining battery power is insufficient, the article transport vehicle may be supplied with the power from another article transport vehicle having sufficient remaining battery power. Therefore, it is possible to prevent a breakdown of the battery and the article transport vehicle.

In addition, according to the embodiment of the present disclosure, the wireless power supply method is applied to the vehicle test facility for inspecting a state of the article transport vehicle. Therefore, it is possible to solve a problem such as a risk of fire or a traveling error that occurs in the related art, and the operator may more easily manage the article transport vehicle. Furthermore, the vehicle test facility may include the charging module that may charge the second power source device included in the article transport vehicle at the time of testing the vehicle. Therefore, the article transport vehicle may be provided on the traveling rail in the state in which the article transport vehicle is fully charged.

The effects of the present disclosure are not limited to the above-mentioned effects, and other effects, which are not mentioned above, may be clearly understood by those skilled in the art from the present specification and the accompanying drawings.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
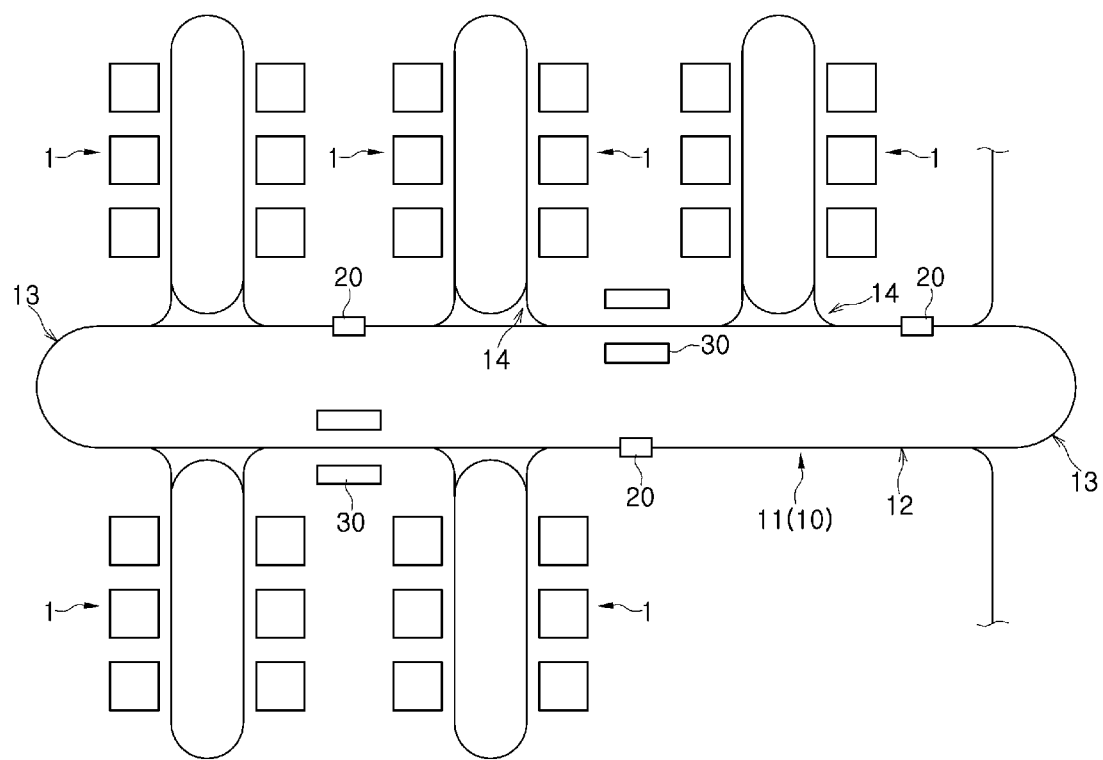
FIG. 1 is a conceptual view illustrating an entire configuration of an article transport facility according to an embodiment of the present disclosure.

Hereinafter, an embodiment of the present disclosure will be described in detail with reference to the accompanying drawings so that those skilled in the technical field to which the present disclosure pertains may easily carry out the embodiment. However, the present disclosure may be implemented in various different ways, and is not limited to the embodiments described herein.

In the description of the embodiment of the present disclosure, the specific descriptions of well-known functions or configurations will be omitted when it is determined that the specific descriptions may unnecessarily obscure the subject matter of the present disclosure. Throughout the drawings, the same reference numerals will be used for components that perform similar functions and operations.

At least some of the terms in the present specification are defined in consideration of the functions in the present disclosure and may vary depending on the intention or usual practice of a user or an operator. Therefore, the terms should be interpreted based on the entire contents of the present specification. In addition, throughout the specification, unless explicitly described to the contrary, the word "comprise" or "include" and variations, such as "comprises", "comprising", "includes" or "including", will be understood to imply the inclusion of stated constituent elements, not the exclusion of any other constituent elements. Further, when one constituent element is referred to as being "connected to (or coupled to)" another constituent element, one constituent element can be "directly connected to (coupled to)" the other constituent element, and one constituent element can also be "indirectly connected to (coupled to)" the other element with other elements interposed therebetween.

Meanwhile, in the drawings, sizes and shapes of components, thicknesses of lines, and the like may be somewhat exaggerated for convenience of understanding.

The present disclosure may be mainly applied to an article transport vehicle for transporting an article from any position to a target position in a factory for manufacturing a semiconductor or a flat panel display (FPD). For example, the article transport vehicle according to the present disclosure may transport the article between facilities for manufacturing semiconductors (or flat panel displays). In this case, the article may include a substrate (or a wafer). For example, the article may be a container that accommodates substrates. Further, the container may be a hermetic container capable of protecting the accommodated substrates from an external environment. Further, the hermetic container may be a front opening unified pod (FOUP).

The article transport vehicle according to the present disclosure may be used to transport the articles in various technical fields. However, the embodiment of the present disclosure will be described, focusing on a case in which the article transport vehicle transports the front opening unified pod (hereinafter, referred to as the 'FOUP') between semiconductor manufacturing facilities in a semiconductor manufacturing factory and the FOUP serves as an article and has an internal space that accommodates wafers.

The semiconductor manufacturing factory may include one or more clean rooms. The semiconductor manufacturing facilities for performing semiconductor manufacturing processes may be installed in the clean rooms. A semiconductor may be completely manufactured by repeatedly performing the semiconductor manufacturing processes on the wafer. The wafer, on which the process has been performed by the specific semiconductor manufacturing facility, may be transported to the subsequent semiconductor manufacturing facility for performing the subsequent process. In this case, the wafer may be transported by an article transport facility, including an overhead transport (OHT), in a state in which the wafer is accommodated in the FOUP.

FIG. 1 conceptually illustrates an entire configuration of an article transport facility according to an embodiment of the present disclosure. In FIG. 1, reference numeral 1 indicates a plurality of semiconductor manufacturing facilities installed in a semiconductor manufacturing factory, and reference numeral 10 indicates traveling rails that define transport routes 11 along which the FOUPs, which are articles, are transported between the semiconductor manufacturing facilities 1. In addition, reference numeral 20 indicates a plurality of article transport vehicles configured to transport the articles while moving along the transport routes 11, and reference numeral 30 indicates a single or plurality of buffers configured to provide spaces for temporarily storing the articles. The traveling rail 10 is installed on a ceiling of the semiconductor manufacturing factory. The article transport vehicle 20 may transport the article from a specific facility directly to another facility among the semiconductor manufacturing facilities 1 or temporarily store the article in the buffer 30 and then transport the article to another facility. The buffer 30 may be a lateral rail buffer installed at a lateral side of the transport route or a lower rail buffer installed at a lower side of the transport route 11.

The article transport facility according to the embodiment of the present disclosure includes the OHT, and the OHT includes the traveling rails 10 and the plurality of article transport vehicles 20. The article transport facility according to the embodiment of the present disclosure is configured such that the article transport vehicles 20 operate by being supplied with driving power from a power supply device through a power supplying unit and a power receiving unit. The article transport facility may further include an integrated control device to automatically manage the article transport vehicles 20. Although not illustrated, the article transport facility may further include facilities such as a test bench, a vehicle module lifter, or a maintenance lifter used to maintain and repair the article transport vehicle 20.

Referring to FIG. 1, the transport route 11 may include one or more straight sections 12 each having a straight shape, one or more curved sections 13 each having a curved shape, and one or more connection sections 14 for branching and/or merging the route.

FIGS. 2 to 5 illustrate the configuration and operation of the OHT.

Figure 2:
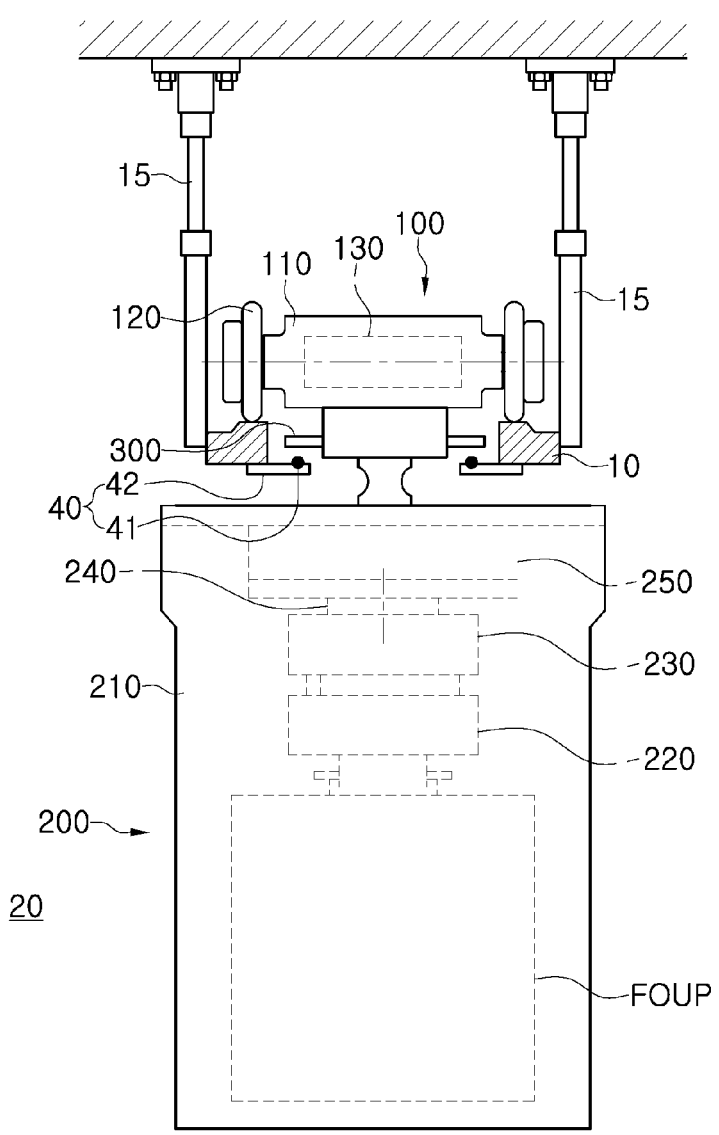
FIGS. 2 and 3 are front and left side views illustrating a configuration of an article transport vehicle illustrated in FIG. 1.

Referring to FIG. 2, the traveling rail 10 includes a pair of rail members spaced apart from each other in a leftward/rightward direction and disposed as a pair. The traveling rail 10 is installed on the ceiling of the semiconductor manufacturing factory by rail supports 15. Each of the rail supports 15 may have a lower end portion for supporting each of the pair of rail members, and an upper end portion fixed to the ceiling of the semiconductor manufacturing factory. The pair of rail members may define traveling surfaces at upper sides thereof.

As illustrated in FIG. 2, the power supplying unit 40 includes electric supply lines 41 disposed below the traveling rail 10 and installed along the transport route 11. A pair of electric supply lines 41 may be provided. The electric supply lines 41 may be disposed between the pair of rail members and supported by line supports 42 mounted on the traveling rail 10. The electric supply lines 41 are electrically connected to the power supply device that provides driving power. For example, the electric supply line 41 may be installed only in the straight section 12 of the transport route 11 and may not be installed in the curved section 13 and the connection section 14 of the transport route 11. Therefore, the transport route 11 may have a power supply section in which the electric supply line 41 is installed, and a non-power supply section in which the electric supply line 41 is not installed.

Figure 3:
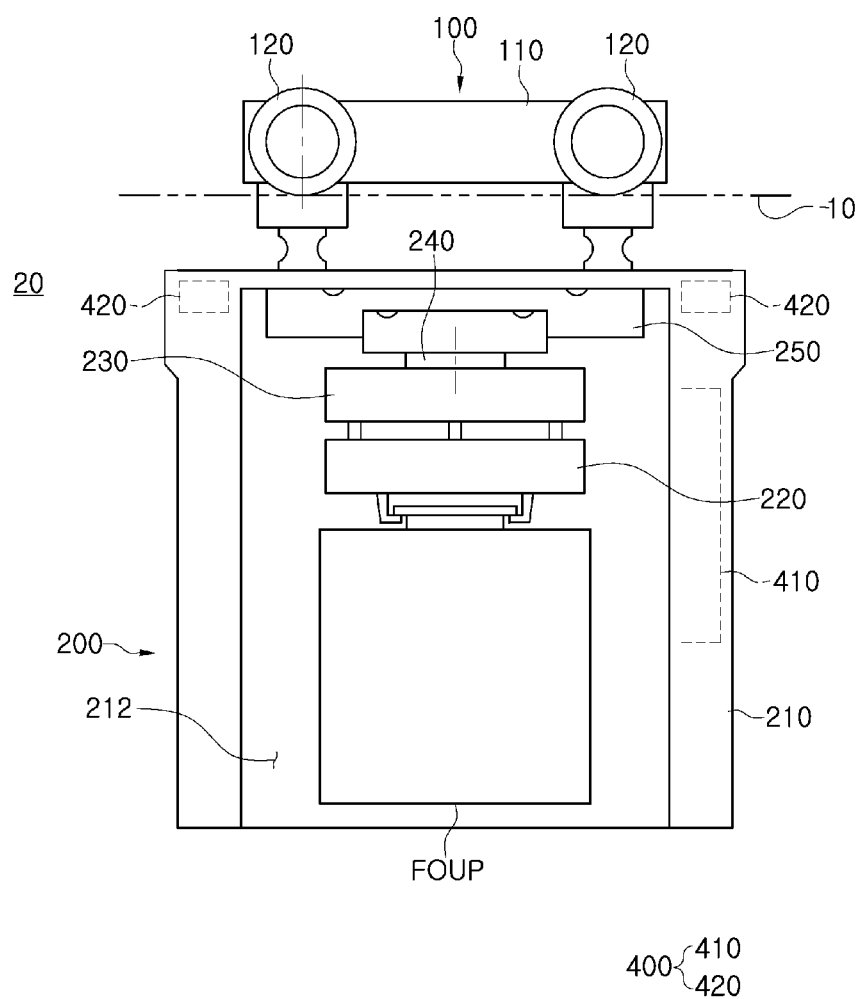

Referring to FIGS. 2 and 3, each of the article transport vehicle 20 includes a vehicle module 100 configured to travel along the traveling rail 10, and a hoist device 200 disposed below the vehicle module 100 and configured to support the FOUP which is the article. The hoist device 200 moves together with the vehicle module 100 and supports the article.

The vehicle module 100 includes a vehicle module body 110 and wheels 120. An axle extending in the leftward/rightward direction is mounted on the vehicle module body 110. The axle is provided in plural, and the plurality of axles may be spaced apart from one another in a forward/rearward direction. The wheels 120 are traveling wheels that impart mobility to the vehicle module body 110 so that the vehicle module body 110 may travel by being guided by the traveling rail 10. The wheels 120 are mounted at two opposite ends of the axle. The wheels 120 may roll in a state in which the wheels 120 are in contact with the traveling surfaces of the pair of rail members. The vehicle module 100 further includes a wheel drive unit 130 configured to provide power for rotating the wheels 120. For example, the wheel drive unit 130 may be configured to rotate the axle.

The hoist device 200 includes a hoist housing 210. The hoist housing 210 is disposed below the traveling rail 10 and connected to the vehicle module 100. An upper portion of the hoist housing 210 may be connected to a lower portion of the vehicle module body 110 by a single or plurality of connectors. The hoist housing 210 defines an accommodation space 212 that accommodates the article. The hoist housing 210 has a structure opened at left and right sides and a lower side thereof so as to move the article from the accommodation space 212 in the leftward/rightward direction and a downward direction.

Further, the hoist device 200 further includes a hand unit 220 configured to grip or release the article, and hand moving units configured to move the hand unit 220 between a first position and a second position. The first position is a position at which the article gripped by the hand unit 220 is accommodated in the accommodation space 212 of the hoist housing 210. The second position is a position disposed outside the hoist housing 210 and spaced apart from the first position. The hoist device 200 includes a vertical drive unit 230, a rotation drive unit 240, and a horizontal drive unit 250 as the hand moving units.

The hand unit 220 may include a hand configured to grip or release the article, and a hand support configured to support the hand. The vertical drive unit 230 moves the hand unit 220 in the upward/downward direction. The vertical drive unit 230 may move the hand unit 220 in the upward/downward direction by winding one or more belts around a drum or unwinding the belts from the drum. The rotation drive unit 240 rotates the hand unit 220 about an axis extending in the upward/downward direction, and the horizontal drive unit 250 moves the hand unit 220 in the leftward/rightward direction. For example, the vertical drive unit 230 moves the hand unit 220 in the upward/downward direction, the rotation drive unit 240 rotates the vertical drive unit 230 about the axis extending in the upward/downward direction, and the horizontal drive unit 250 moves the rotation drive unit 240 in the leftward/rightward direction. Therefore, the article gripped by the hand unit 220 may be moved in the upward/downward direction, rotated about the axis extending in the upward/downward direction, or moved in the leftward/rightward direction.

Figure 4:
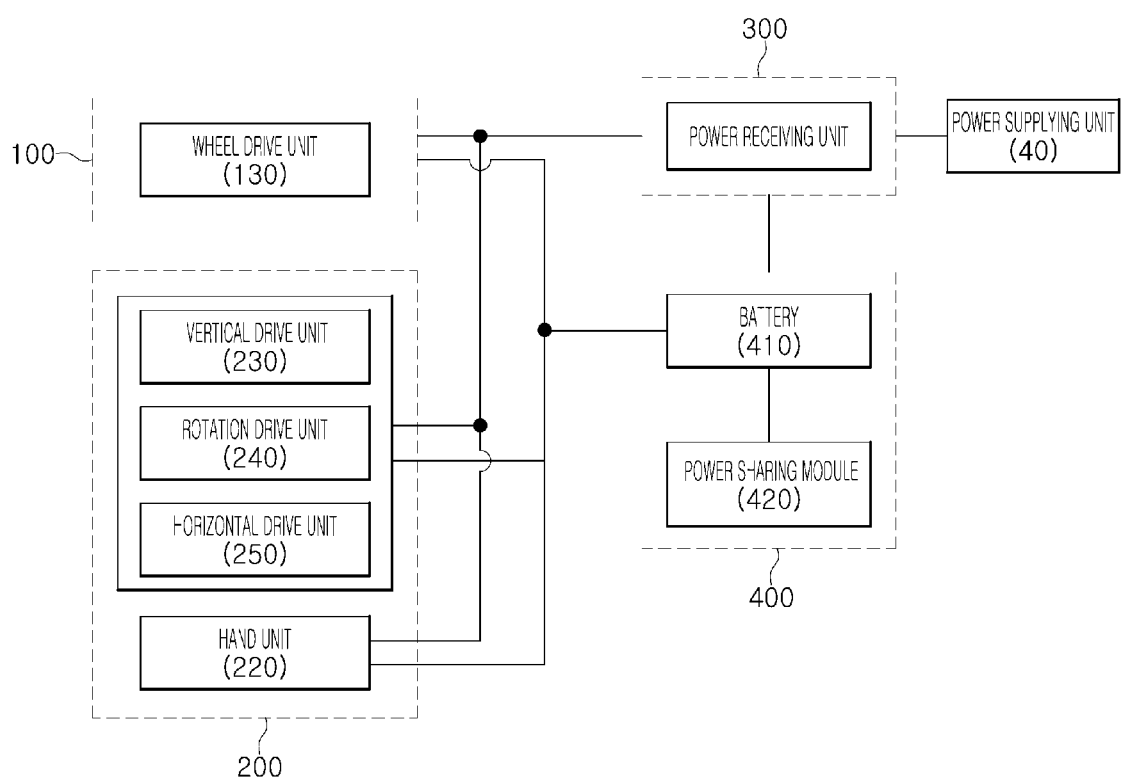
FIG. 4 is a block diagram illustrating configurations of first and second power source devices illustrated in FIGS. 2 and 3.

FIG. 4 illustrates configurations of power source devices applied to the article transport vehicle 20, and FIGS. 5 to 9 illustrate operations of the power source devices.

The article transport vehicles 20 each have a vehicle main body, and the vehicle main body includes the vehicle module 100 and the hoist device 200 as described above. As illustrated in FIGS. 2 and 3, the article transport vehicles 20 each further include a first power source device (main power source device) 300 configured to receive power from the electric supply line 41 in a non-contact manner and supply the power to the vehicle main body, and a second power source device (sub-power source device) 400 configured to supply power, stored in the battery 410, to the vehicle main body and share power with a neighboring vehicle main body by means of a power sharing module 420.

The first power source device 300 includes a power receiving unit disposed below the vehicle module 100 or above the hoist device 200 and provided to face the electric supply line 41. The power receiving unit may include a pick-up coil and a rectifier. Because alternating current flows in the electric supply line 41, directions and strength of magnetic flux generated in the vicinity of the electric supply line 41 are consistently changed. The pick-up coil may generate a voltage through electromagnetic induction resulting from the change in magnetic flux. The generated voltage is an alternating current voltage. However, the alternating current voltage may be converted into a direct current voltage by the rectifier and then supplied to the vehicle main body.

The battery 410 may receive power from the first power source device 300, store the power, and supply the stored power to the vehicle main body.

The power sharing module 420 is electrically connected to the battery 410. The power sharing module 420 may receive power from the battery 410 of another vehicle main body or supply power to the battery 410 of another vehicle main body. That is, the power sharing module 420 may share the power with the battery 410 of another vehicle main body.

The battery 410 and the power sharing module 420 may be provided in plural, and the plurality of batteries 410 and the plurality of power sharing modules 420 are respectively disposed at a plurality of positions on the vehicle main body. As illustrated in FIG. 3, the battery 410 and the power sharing module 420 may be mounted on the hoist device 200, which is more structurally advantageous in ensuring a mounting space. Specifically, the battery 410 and the power sharing module 420 may be embedded in the hoist housing 210. In this case, the power sharing module 420 may be provided in plural to make it easy to share power between the adjacent vehicles.

The second power source device 400 further includes a power control unit configured to control a supply of power from the battery 410.

The power control unit may control the supply of power so that the power stored in the battery 410 is supplied to the wheel drive unit 130 of the vehicle module 100 when the vehicle module 100 travels. In addition, the power control unit may control the supply of power so that the power stored in the battery 410 is supplied to the hand moving units when the hand moving units (the vertical drive unit 230, the rotation drive unit 240, and the horizontal drive unit 250) operate. Further, the power control unit may control the supply of power so that the power stored in the battery 410 is supplied to the hand unit 220 when the hand unit 220 operates.

Figure 5:
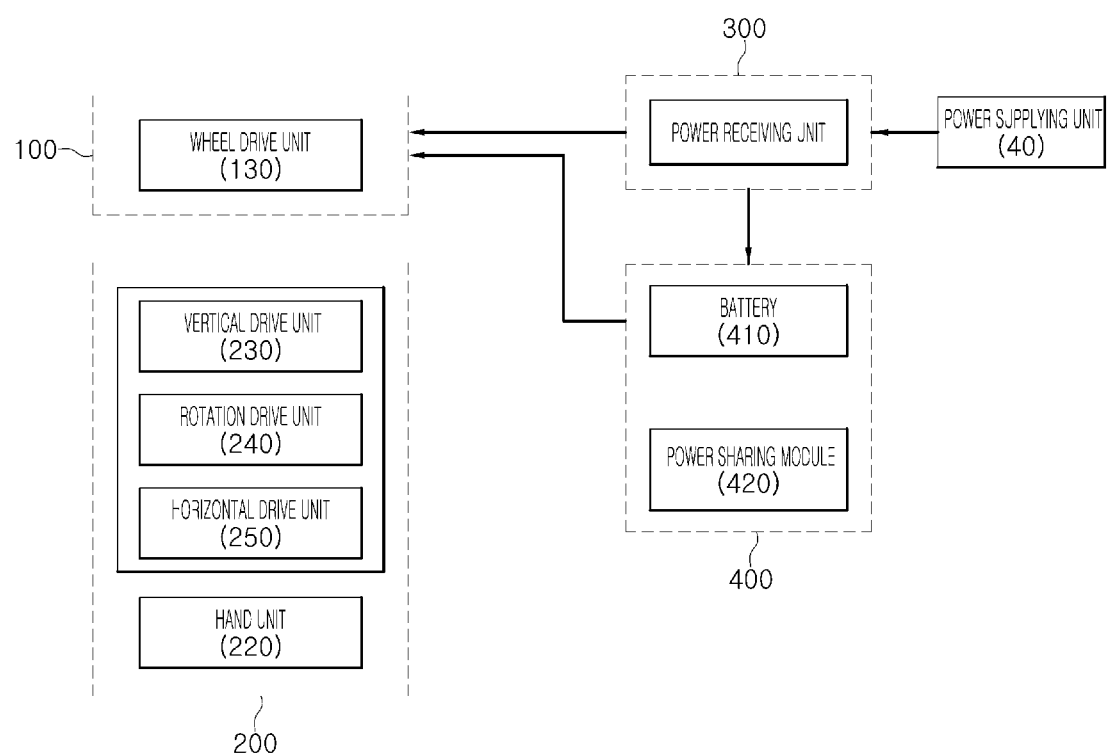
FIGS. 5 to 10 are block diagrams schematically illustrating operations of the first and second power source devices illustrated in FIGS. 2 and 3.

When the article transport vehicle 20 operates in a traveling mode, the vehicle module 100 may travel by being supplied with power from the first power source device 300 and the battery 410 (see FIG. 5).

Figure 6:
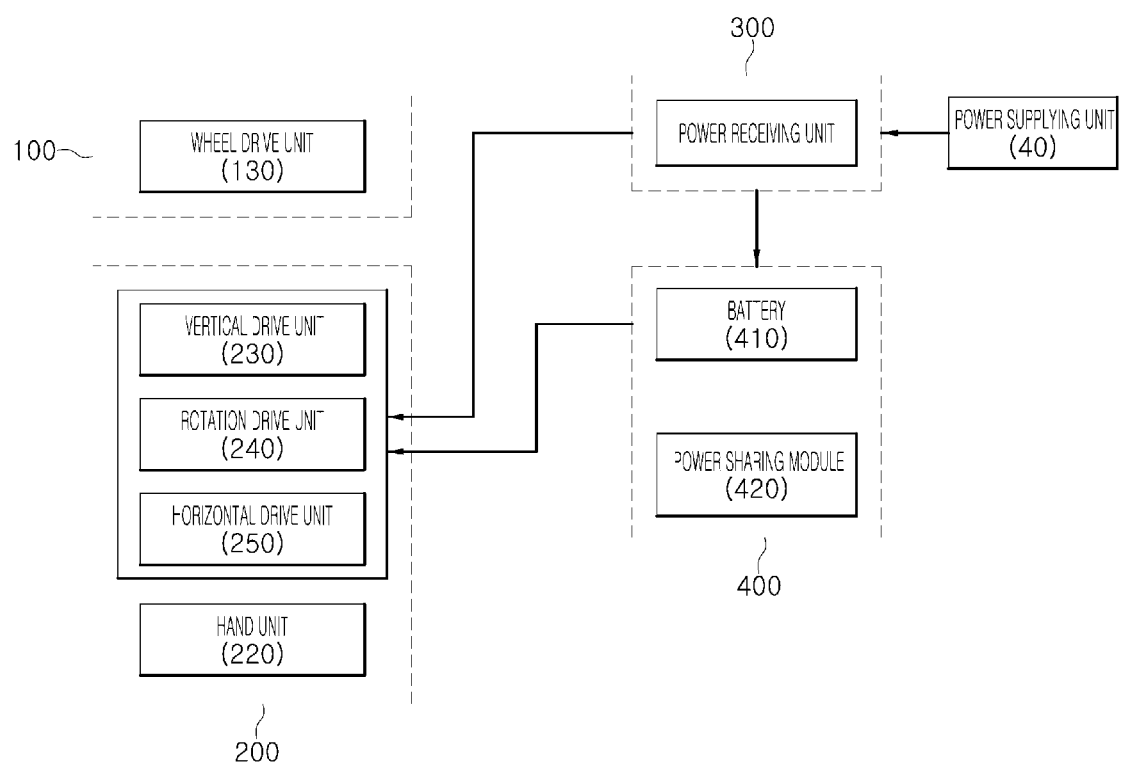
Figure 7:
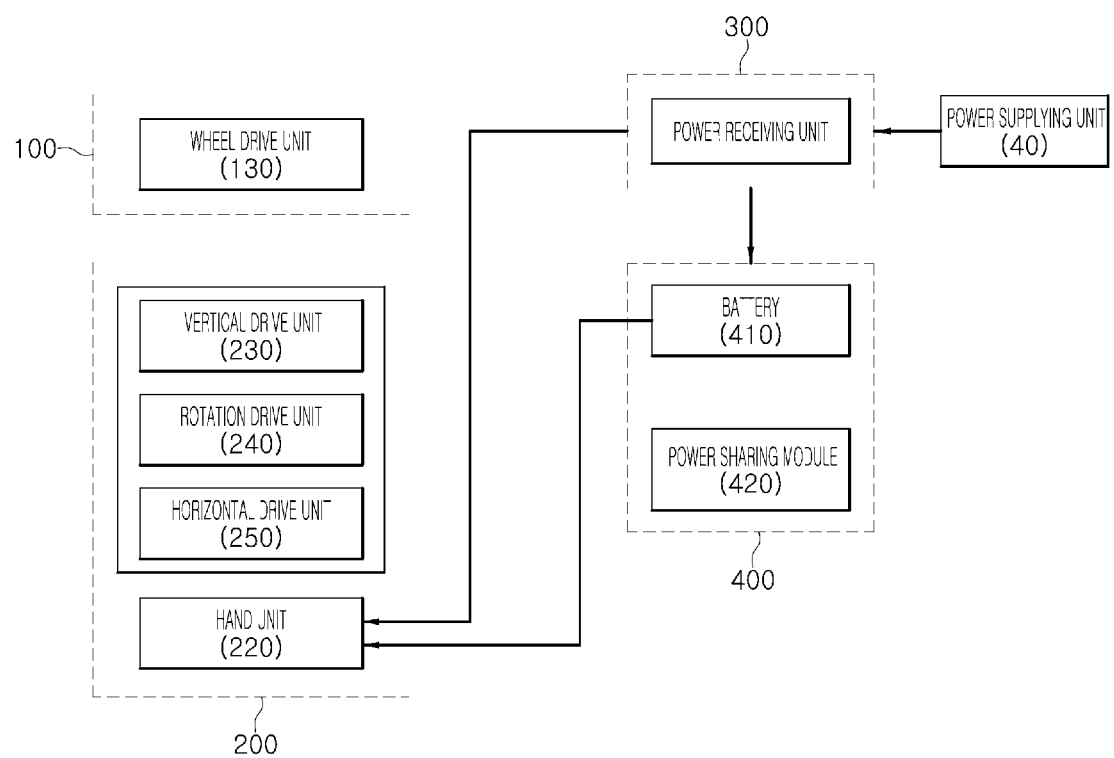
Figure 8:
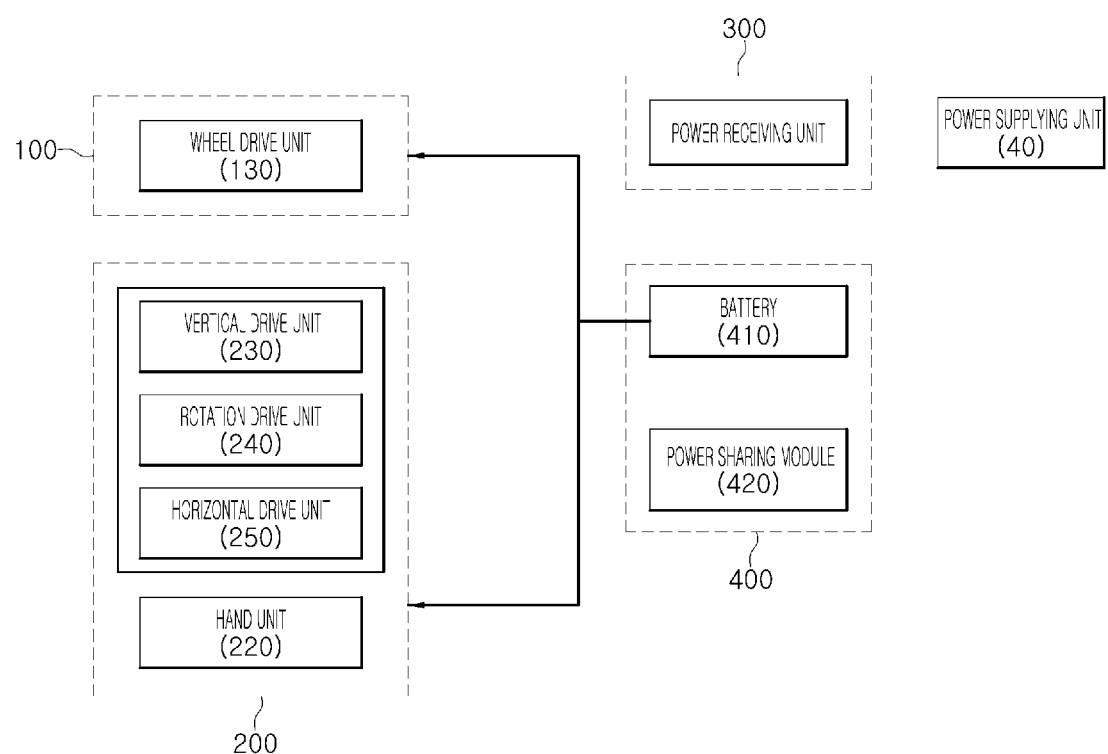

In addition, when the article transport vehicle 20 operates in a loading/unloading mode for loading or unloading the article, the hoist device 200 may perform a loading/unloading operation by being supplied with power from the first power source device 300 and the battery 410 (see FIGS. 6 and 7). Specifically, the hand moving units (the vertical drive unit 230, the rotation drive unit 240, and the horizontal drive unit 250) may operate by being supplied with power from the first power source device 300 and the battery 410 to move the hand unit 220 in the loading/unloading mode (see FIG. 6). The hand unit 220 may operate by being supplied with power from the first power source device 300 and the battery 410 to grip or release the article (see FIG. 7).

Meanwhile, the second power source device 400 may normally operate the vehicle main body even though the supply of power from the first power source device 300 to the vehicle main body is cut off. For example, the vehicle module 100 may normally travel by being continuously supplied with the power from the battery 410 and the hand moving units and the hand unit 220 of the hoist device 200 may normally operate by being continuously supplied with the power from the battery 410 even though the supply of power from the first power source device 300 is cut off when the vehicle module 100 enters the non-power supply section in the traveling mode or when a power failure occurs (see FIG. 8).

Meanwhile, when the supply of power from the first power source device to the vehicle main body is cut off, the power control unit may control the article transport vehicles 20 on the traveling rail 10 so that the article transport vehicles 20 share the amount of power of the batteries 410 to consistently supply the power.

For the convenience of description of the operations of the article transport vehicles 20 sharing the power, one article transport vehicle existing on the traveling rail 10 is referred to as a first article transport vehicle, and another article transport vehicle is referred to as a second article transport vehicle.

Figure 9:
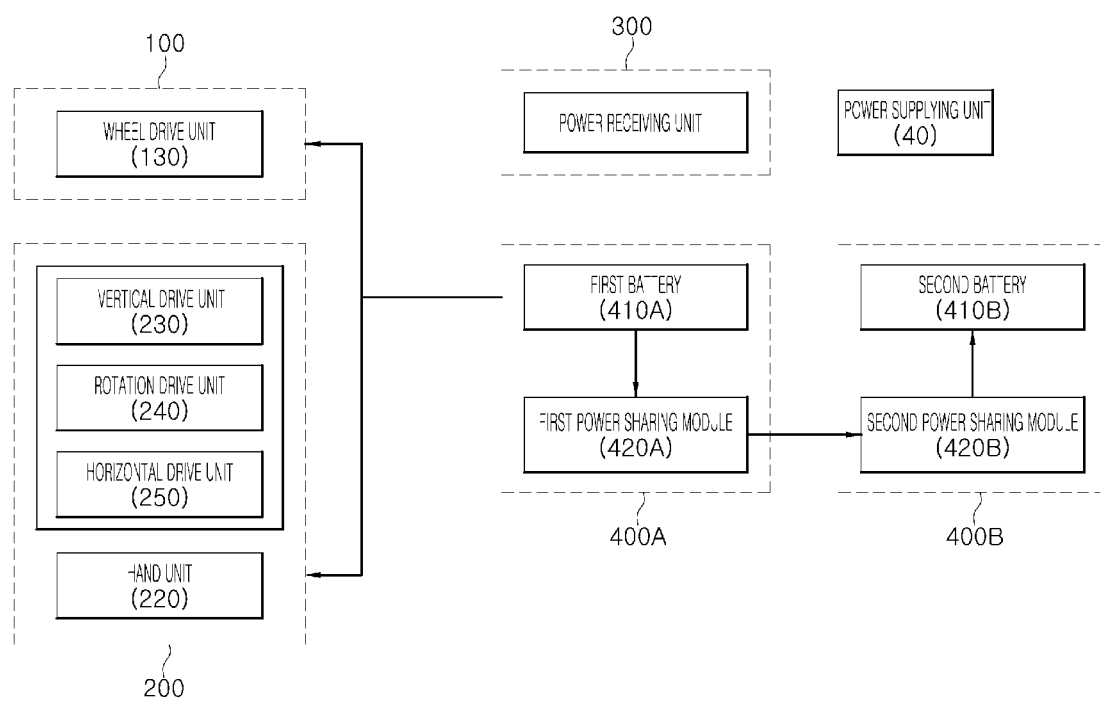

For example, as illustrated in FIG. 9, a sufficient amount of power is stored in a first battery 410A included in the first article transport vehicle, and the amount of power stored in a second battery 410B included in the second article transport vehicle is equal to or smaller than a predetermined amount of power or no power is stored in the second battery 410B. In this case, the integrated control device may control the first article transport vehicle to allow the first article transport vehicle to approach the second article transport vehicle. The power control unit of the first article transport vehicle may control a first power sharing module 420A to supply the second article transport vehicle with the power of the first battery 410A. The first power sharing module 420A may discharge electricity from the first battery 410A and provide the second article transport vehicle with the power stored in the first battery 410A. In this case, the power control unit of the second article transport vehicle may control a second power sharing module 420B to store the power, provided from the first battery 410A, in the second battery 410B. The second power sharing module 420B charges the second battery 410B with the power provided from the first article transport vehicle.

Figure 10:
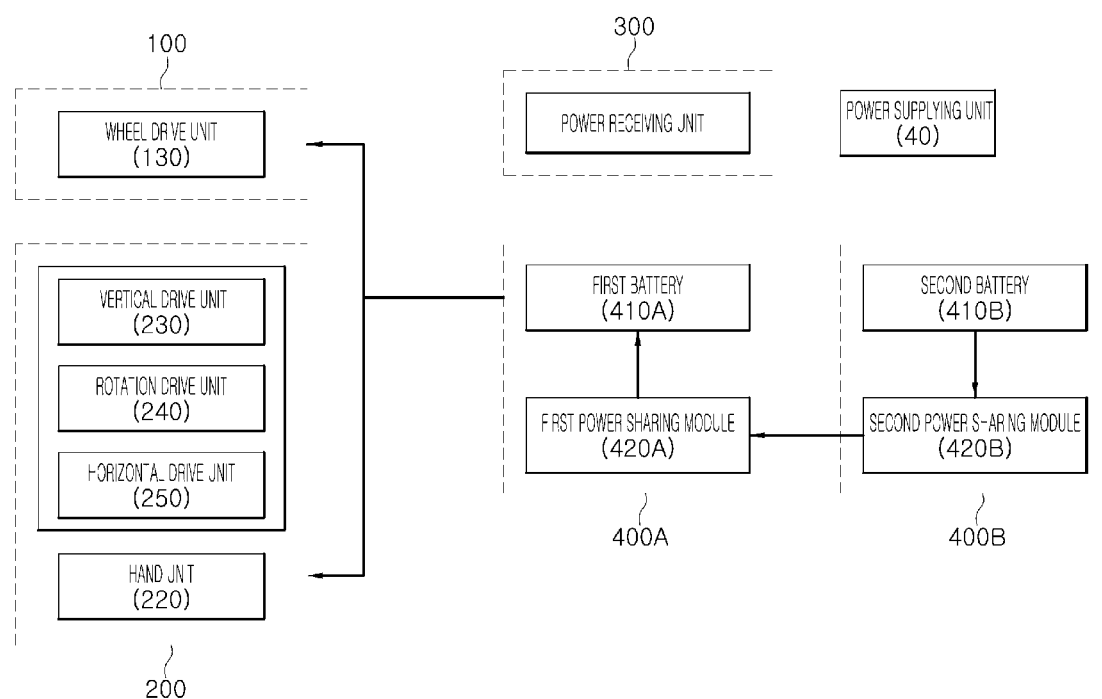

On the contrary, as illustrated in FIG. 10, the amount of power stored in the first battery 410A included in the first article transport vehicle is equal to or smaller than a predetermined amount of power or no power is stored in the first battery 410A. Further, a sufficient amount of power is stored in the second battery 410B included in the second article transport vehicle. In this case, the integrated control device may control the second article transport vehicle to allow the second article transport vehicle to approach the first article transport vehicle. The power control unit of the first article transport vehicle may control the first power sharing module 420A to provide the second article transport vehicle with the power of the first battery 410A. The first power sharing module 420A charges the first battery 410A with the power provided from the second article transport vehicle. In this case, the power control unit of the second article transport vehicle may control the second power sharing module 420B to provide the first article transport vehicle with the power of the second battery 410B. The second power sharing module 420B discharges electricity from the second battery 410B and provides the power to the first article transport vehicle 20A.

As described above, the article transport vehicle 20 according to the present disclosure may control the power sharing module to recognize the remaining battery power of another peripheral vehicle and provide or receive the power. That is, the vehicle may share the amount of power of the battery 410 with the other vehicles. Therefore, the article transport facility may normally operate by preventing or fixing a breakdown of the article transport vehicle 20.

Meanwhile, the power may be shared between the plurality of power sharing modules 420 or between the power sharing module and the battery in a wired manner or a wireless manner that may improve spatial utilization.

Figure 11:
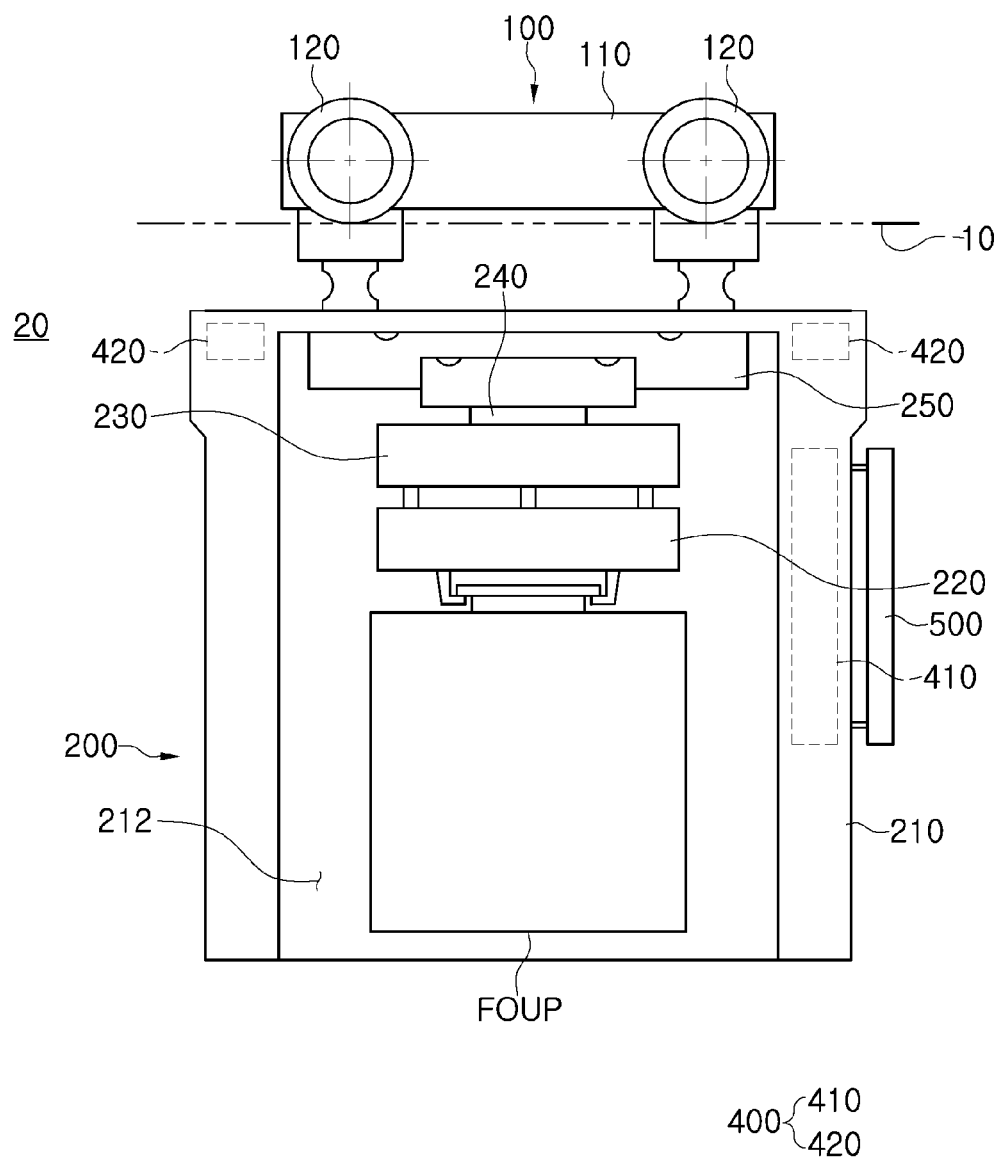
FIG. 11 is a left side view illustrating a configuration of an article transport vehicle according to another embodiment of the present disclosure.
Figure 12:
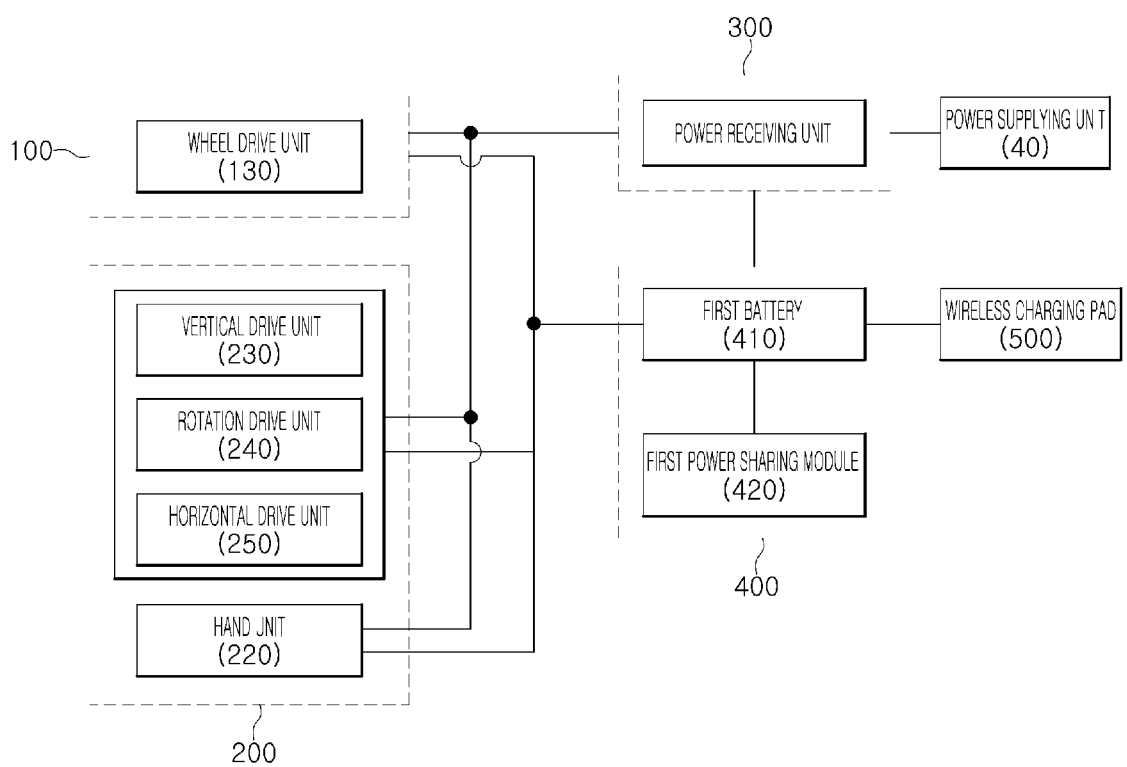
FIG. 12 is a block diagram illustrating a configuration of the article transport vehicle according to another embodiment of the present disclosure.

FIGS. 11 and 12 are views illustrating an article transport vehicle according to another embodiment of the present disclosure.

The article transport vehicle according to another embodiment of the present disclosure may further include a wireless charging pad 500 capable of charging the battery 410 in a non-contact manner. The wireless charging pad 500 may be disposed on an outer wall of the hoist housing 210 and fixed at a position corresponding to the battery 410. In this case, as illustrated in FIG. 11, the wireless charging pad 500 may be fixed by a separate support or fixed by a fixing magnet provided between the wireless charging pad 500 and the hoist housing 210.

In addition, although not illustrated, the wireless charging pad 500 may further include a power supplying pad for supplying power to the battery 410 in a non-contact manner. The battery 410 may further include a power receiving pad for receiving power from the wireless charging pad 500. The power supplying pad may be attached to the wireless charging pad 500 or embedded in the wireless charging pad 500. Likewise, the power receiving pad may be attached to the battery 410 or embedded in the battery 410.

The wireless charging pad 500 may charge the battery 410 and supply the power to the article transport vehicle when the power is not supplied from the power supplying unit 40, when the amount of power stored in the battery 410 is equal to or smaller than a predetermined amount, or when the article transport vehicles cannot share the power. Alternatively, when the amount of power stored in the battery 410 is consumed overall, the wireless charging pad 500 may charge the battery 410 without requiring an operator to perform a separate manipulation.

FIG. 12 is a view illustrating a configuration of the power source device applied to the article transport vehicle 20 according to another embodiment of the present disclosure. Referring to FIG. 12, according to the article transport vehicle according to another embodiment of the present disclosure, the power may be stored in the battery 410 by the first power source device 300, the power sharing module 420, or the wireless charging pad 500. Therefore, the article transport vehicle according to the embodiment of the present disclosure may normally operate using the power of the battery 410 even though the non-power supply section is long.

Meanwhile, the article transport facility according to the embodiment of the present disclosure may further include a vehicle test facility 600 that inspects a state of the article transport vehicle 20 before the article transport vehicle 20 is placed on the traveling rail 10.

Figure 13:
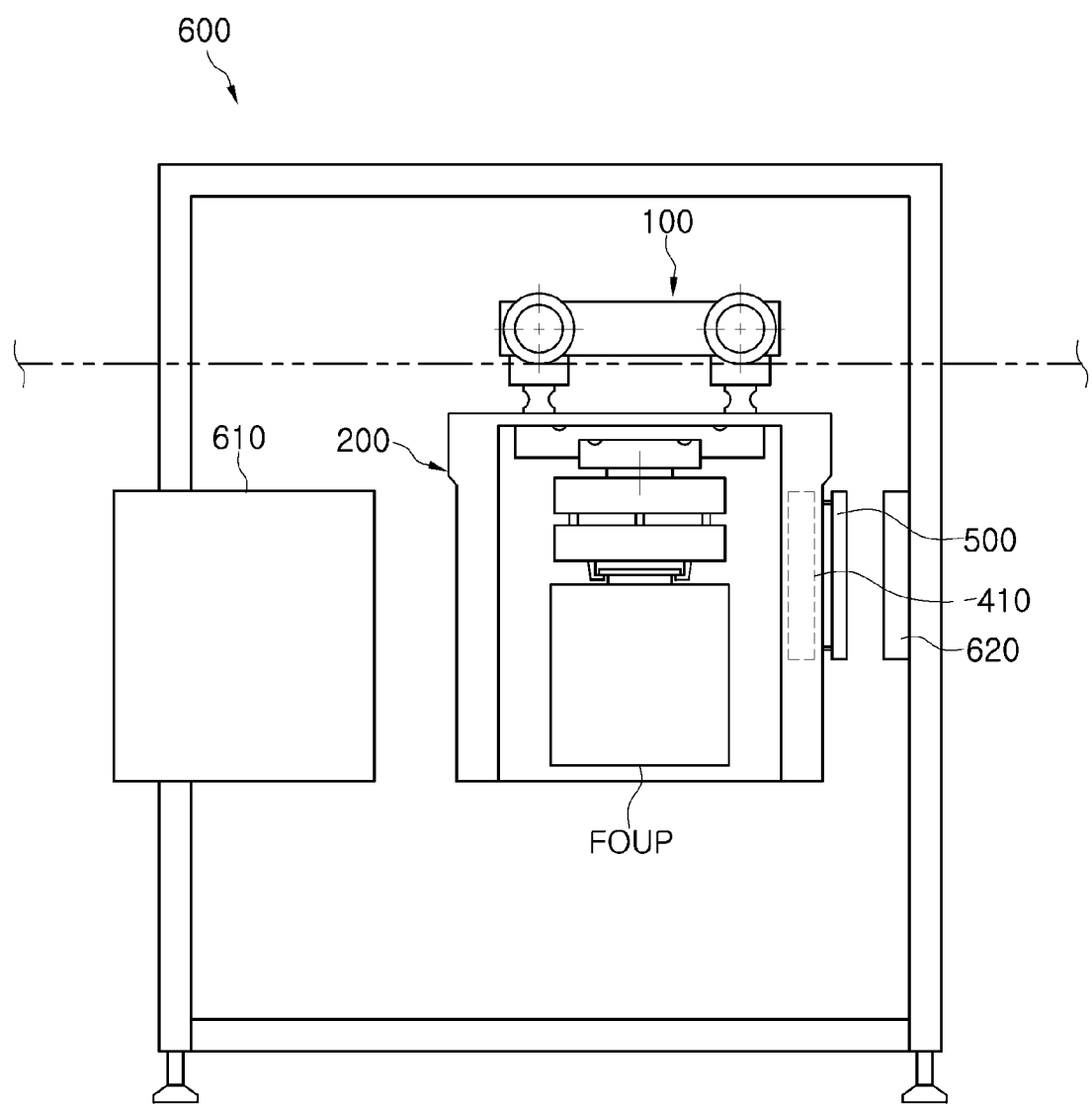
FIG. 13 is a side view schematically illustrating a configuration of a vehicle test facility according to the embodiment of the present disclosure.
Figure 14:
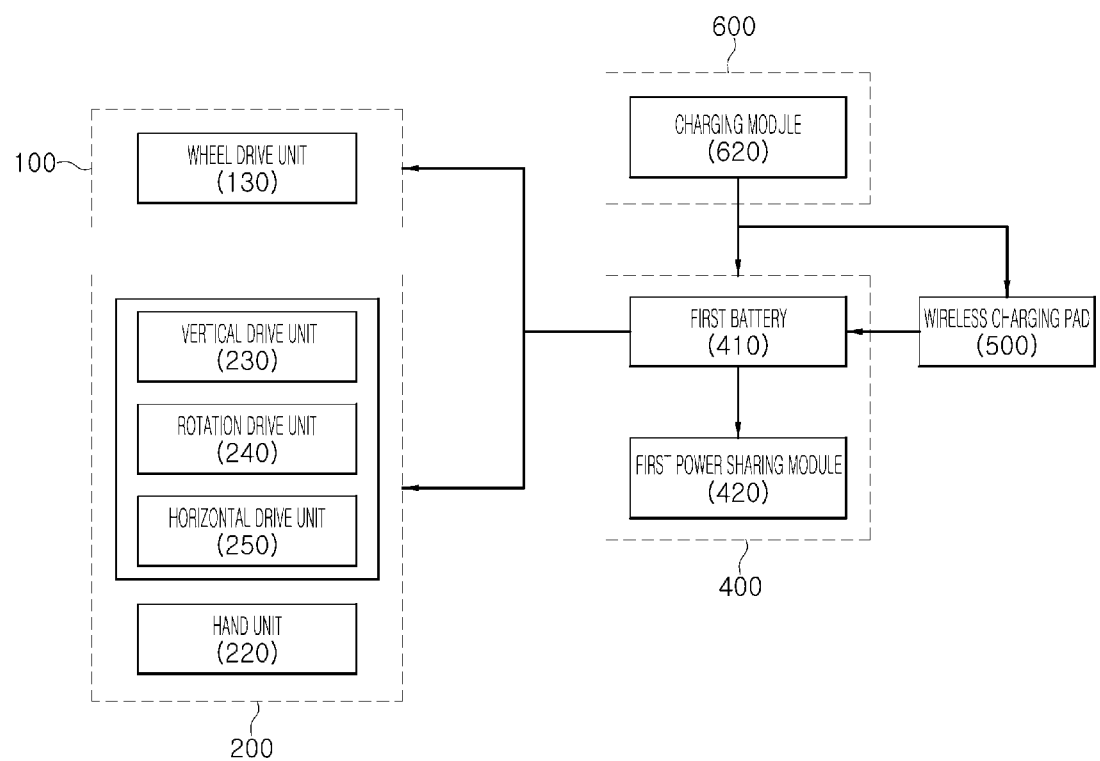
FIG. 14 is a block diagram schematically illustrating an operation of the vehicle test facility illustrated in FIG. 13.

FIGS. 13 and 14 are views schematically illustrating a configuration and an operation of the vehicle test facility according to the embodiment of the present disclosure.

The vehicle test facility 600 is configured to check whether the article transport vehicle 20 normally operates. The vehicle test facility 600 inspects the article transport vehicle 20 after supplying the power to the article transport vehicle 20. The vehicle test facility 600 according to the embodiment of the present disclosure may provide the power in a wireless manner. Specifically, as illustrated in FIG. 13, the vehicle test facility 600 may provide the power to the article transport vehicle 20 in a non-contact manner when a state of the article transport vehicle 20 loaded in the vehicle test facility 600 is inspected. For example, the above-mentioned power supplying unit may be included in the vehicle test facility 600 to supply the power to the first power source device. The vehicle test facility 600 may be configured to provide the power to the article transport vehicle 20 in a non-contact manner, thereby preventing a problematic situation by removing a risk of fire or a traveling error that may occur in the vehicle test facility in the related art.

In addition, the vehicle test facility 600 may include a manipulation unit 610 configured to manipulate the facility, and a charging module 620 configured to charge the second power source device 400 of the article transport vehicle 20 which is loaded into the facility so as to be inspected. Specifically, the charging module 620 may charge the battery 410 or the wireless charging pad 500. The charging module 620 may supply the power to the battery 410 or the wireless charging pad 500 at the time of inspecting the vehicle. Like the wireless charging pad 500, the charging module 620 may provide the power to the battery 410 or the wireless charging pad 500 in a non-contact manner. Further, the charging module 620 may be configured to perform quick charging. The article transport vehicle 20, which has been inspected in the vehicle test facility 600 by the charging module 620, may enter the traveling rail 10 in a state in which the battery 410 is fully charged.

Meanwhile, the charging module may be included in the vehicle test facility 600 and the buffer 30 disposed at one side of the traveling rail 10. The charging module may be included in a facility such as a lifter disposed at the periphery of the rail. Alternatively, the charging module may be provided as an independent component on the traveling rail 10. The charging module 620 may be installed on an upper or lateral portion of the facility disposed at the periphery of the traveling rail 10. The charging module 620 may supply, in a non-contact manner, the power to the battery 410 or the wireless charging pad 500 of the article transport vehicle 20 loaded into the facility including the charging module 620. That is, since the charging module 620 is applied to the facility disposed at the periphery of the rail, the facility disposed at the periphery of the rail may further serve as a wireless charging device for charging the battery 410 or the wireless charging pad 500. Therefore, the power may be more smoothly supplied to the article transport vehicle 20.

As described above, the article transport vehicle according to the embodiment of the present disclosure includes the first power source device configured to receive the power from the electric supply line and supply the power to the article transport vehicle, and the second power source device configured to store the power from the first power source device and supply the power to the article transport vehicle. Therefore, the article transport vehicle may normally operate even though the transport route includes the non-power supply section. In addition, since the second power source device includes the power sharing module, one article transport vehicle may share the power of the battery with another article transport vehicle. Therefore, when the remaining battery power is insufficient due a long non-power supply section, the article transport vehicle may be supplied with the power from another article transport vehicle having sufficient remaining battery power. Therefore, it is possible to prevent a breakdown of the battery and the article transport vehicle.

In addition, according to the embodiment of the present disclosure, the wireless power supply method is applied to the vehicle test facility for inspecting a state of the article transport vehicle. Therefore, it is possible to solve a problem such as a risk of fire or a traveling error that occurs in the related art, and the operator may more easily manage the article transport vehicle. Furthermore, the vehicle test facility may include the charging module that may charge the second power source device included in the article transport vehicle at the time of testing the vehicle. Therefore, the article transport vehicle may be provided on the traveling rail in the state in which the article transport vehicle is fully charged.

Meanwhile, according to the above-mentioned configuration, it is possible to implement the article transport facility that does not require the electric supply line disposed along the traveling rail 10. Alternatively, the electric supply line may be installed only in a minimum region in which the charging module is disposed. Accordingly, it is possible to greatly reduce manufacturing and maintenance costs and prevent a safety accident that may occur during a process of installing, maintaining, and repairing a power supply cable.

While the present disclosure has been described above, the present disclosure is not limited to the disclosed embodiments and the accompanying drawings, and those skilled in the art may variously modify the present disclosure without departing from the technical spirit of the present disclosure. In addition, the technical features described in the embodiments of the present disclosure may be independently carried out or two or more technical features may be combined.

What is claimed is:

1. An article transport vehicle comprising:
a vehicle main body configured to transport an article while traveling along a traveling rail;
a first power source device configured to receive power from an electric supply line installed at the traveling rail and supply the power to the vehicle main body; and
a second power source device comprising a battery and a power sharing module disposed on the vehicle main body, the second power source device being configured to supply power, stored in the battery, to the vehicle main body,
wherein the second power source device further comprises a power control unit,
wherein the power control unit is configured to control a supply of power so that the power stored in the battery is supplied to the vehicle main body when a supply of power from the first power source device to the vehicle main body is cut off, and
wherein when the supply of power from the first power source device to the vehicle main body is cut off and an amount of power stored in the battery is sufficient, the power control unit is configured to control the power sharing module to provide power to another vehicle in which the amount of power stored in the battery is equal to or smaller than a predetermined amount of power or no power is stored in the battery.

2. The article transport vehicle of claim 1, wherein the second power source device is configured such that the battery receives the power from the first power source device and stores the power.

3. The article transport vehicle of claim 1, wherein the second power source device is configured such that the battery shares power with a battery of another vehicle by means of the power sharing module.

4. The article transport vehicle of claim 1, wherein the vehicle main body comprises:
a vehicle module configured to travel along the traveling rail; and
a hoist device disposed below the vehicle module and configured to support the article, and
wherein the second power source device is disposed on the hoist device.

5. The article transport vehicle of claim 4, wherein the hoist device comprises:
a hoist housing configured to define an accommodation space that accommodates the article;
a hand unit configured to grip or release the article; and
a hand moving unit configured to move the hand unit between a first position at which the article is accommodated in the accommodation space and a second position spaced apart from the first position, and
wherein the second power source device is mounted on the hoist housing.

6. The article transport vehicle of claim 5, further comprising:
a wireless charging pad configured to supply power to the battery.

7. The article transport vehicle of claim 6, wherein the wireless charging pad is disposed on an outer wall of the hoist housing and fixed at a position corresponding to the battery.

8. The article transport vehicle of claim 6, wherein the wireless charging pad is configured to charge the battery when an amount of power stored in the battery is equal to or smaller than a predetermined amount of power.

9. The article transport vehicle of claim 1, wherein when the supply of power from the first power source device to the vehicle main body is cut off and an amount of power stored in the battery is equal to or smaller than a predetermined amount of power or no power is stored in the battery, the power control unit is configured to control the power sharing module to receive power from another vehicle in which the amount of power stored in the battery is sufficient.

10. The article transport vehicle of claim 1, wherein the power sharing module is configured to operate in a wireless manner.

11. An article transport facility comprising:
a traveling rail disposed on a ceiling and configured to provide a transport route for transporting an article;
an electric supply line installed at the traveling rail;

at least one article transport vehicle comprising:
a vehicle module configured to travel along the traveling rail,
and a hoist device disposed below the vehicle module and configured to support the article;
a first power source device configured to receive power from the electric supply line and supply the power to the vehicle module and the hoist device of the at least one article transport vehicle;
a second power source device comprising a battery provided in the hoist device, and a power sharing module configured to share power of the battery with another article transport vehicle, the second power source device being configured to supply the vehicle module and the hoist device with the power stored in the battery; and
a wireless charging pad configured to supply the power to the battery,
wherein the second power source device is configured to receive power from the first power source device, the power sharing module, or the wireless charging pad and store the power in the battery,
wherein the second power source device is configured to control a supply of power so that the power stored in the battery is supplied to the vehicle module when a supply of power from the first power source device to the vehicle module is cut off, and
wherein when an amount of power stored in the battery is sufficient, the second power source device is configured to control the power sharing module to approach and provide power to another vehicle in which the amount of power stored in the battery is equal to or smaller than a predetermined amount of power or no power is stored in the battery.

12. The article transport facility of claim 11,
wherein the hoist device comprises:
a hoist housing configured to provide an accommodation space that accommodates the article;
a hand unit configured to grip or release the article; and
a hand moving unit configured to move the hand unit.

13. The article transport facility of claim 11,
wherein when the amount of power stored in the battery is equal to or smaller than a predetermined amount of power or no power is stored in the battery, the second power source device is configured to control the power sharing module to receive power from another vehicle in which the amount of power stored in the battery is sufficient.

14. The article transport facility of claim 11,
wherein the wireless charging pad is configured to charge the battery when an amount of power stored in the battery is equal to or smaller than a predetermined amount of power.

15. The article transport facility of claim 11, further comprising:
a vehicle test facility configured to supply power in a wireless manner and inspect a state of the article transport vehicle before the article transport vehicle is loaded to the traveling rail.

16. The article transport facility of claim 15,
wherein the vehicle test facility comprises a charging module configured to charge the second power source device included in the article transport vehicle.

17. The article transport facility of claim 16,
wherein the charging module is configured to charge the battery in a non-contact manner or quickly charge the battery.

18. An article transport facility comprising:
a traveling rail disposed on a ceiling and configured to provide a transport route for transporting an article;
an electric supply line installed on the traveling rail;
at least one article transport vehicle comprising a vehicle module configured to travel along the traveling rail, and a hoist device disposed below the vehicle module and configured to support the article;
a first power source device configured to receive power from the electric supply line and supply the power to the vehicle module and the hoist device of the at least one article transport vehicle;
a second power source device comprising a battery provided in the hoist device, and a power sharing module configured to share power of the battery with another article transport vehicle, the second power source device being configured to supply the vehicle module and the hoist device with the power stored in the battery;
a wireless charging pad configured to supply the power to the battery; and
a vehicle test facility configured to inspect a state of the article transport vehicle and supply power in a wireless manner,
wherein the second power source device is configured to receive power from the first power source device, the power sharing module, or the wireless charging pad and store the power in the battery,
wherein the vehicle test facility comprises a charging module configured to charge the battery included in the second power source device,
wherein the second power source device is configured to control a supply of power so that the power stored in the battery is supplied to the vehicle module when a supply of power from the first power source device to the vehicle module is cut off, and
wherein when an amount of power stored in the battery is sufficient, the second power source device is configured to control the power sharing module to approach and provide power to another vehicle in which the amount of power stored in the battery is equal to or smaller than a predetermined amount of power or no power is stored in the battery.

* * * * *